United States Patent
Tung et al.

(10) Patent No.: US 10,524,387 B2
(45) Date of Patent: Dec. 31, 2019

(54) HEAT DISSIPATION CONTROL METHOD AND IMMERSION COOLING SYSTEM THEREOF

(71) Applicants: Inventec (Pudong) Technology Corp., Shanghai (CN); Inventec Corporation, Taipei (TW)

(72) Inventors: Kai-Yang Tung, Taipei (TW); Hung-Ju Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 189 days.

(21) Appl. No.: 15/862,639

(22) Filed: Jan. 5, 2018

(65) Prior Publication Data

US 2019/0159359 A1 May 23, 2019

(30) Foreign Application Priority Data

Nov. 17, 2017 (CN) .......................... 2017 1 1141849

(51) Int. Cl.
*H05K 7/20* (2006.01)

(52) U.S. Cl.
CPC ......... *H05K 7/203* (2013.01); *H05K 7/20209* (2013.01); *H05K 7/208* (2013.01); *H05K 7/20836* (2013.01)

(58) Field of Classification Search
CPC .... H05K 7/20209; H05K 7/203; H05K 7/208; H05K 7/20836
See application file for complete search history.

(56) References Cited

U.S. PATENT DOCUMENTS

| | | | |
|---|---|---|---|
| 7,331,190 B2* | 2/2008 | Garner | F01P 3/22 257/E23.08 |
| 2014/0069626 A1* | 3/2014 | Lin | G06F 1/20 165/287 |
| 2014/0104784 A1* | 4/2014 | Chen | G06F 1/206 361/679.47 |
| 2015/0062817 A1* | 3/2015 | Lin | H05K 7/20136 361/696 |
| 2016/0120059 A1* | 4/2016 | Shedd | H05K 7/208 165/244 |
| 2017/0142868 A1* | 5/2017 | Chen | F28C 1/00 |

(Continued)

*Primary Examiner* — Jacob R Crum
(74) *Attorney, Agent, or Firm* — Winston Hsu

(57) ABSTRACT

A heat dissipation control method is applied to an immersion cooling apparatus for cooling a heat generating member. The immersion cooling apparatus includes a cooling chamber, a fan device, and a pump communicated with the cooling chamber and the fan device for transmitting vapor generated by a cooling solution to the fan device and transmitting the cooling solution to the cooling chamber. The heat generating member is immersed in the cooling solution stored in the cooling chamber. The fan device cools the vapor into liquid. The heat dissipation control method includes utilizing a sensing processor to detect a vapor temperature, the sensing processor preferentially increasing power of the pump when determining the vapor temperature is larger than a maximum of a temperature control range, and the sensing processor preferentially decreasing power of the fan device when determining the vapor temperature is less than a minimum of the temperature control range.

10 Claims, 2 Drawing Sheets

(56) References Cited

U.S. PATENT DOCUMENTS

2017/0278773 A1* 9/2017 Hwang .................. G06F 1/206
2017/0303434 A1* 10/2017 Katsumata ............. H01L 23/44
2017/0303443 A1* 10/2017 Inano ................... H05K 7/2079
2017/0325355 A1* 11/2017 Lau ..................... H05K 7/2029

* cited by examiner

HEAT DISSIPATION CONTROL METHOD AND IMMERSION COOLING SYSTEM THEREOF

BACKGROUND OF THE INVENTION

1. Field of the Invention

The present invention relates to a heat dissipation control method and an immersion cooling system thereof, and more specifically, to a heat dissipation control method of utilizing a sensing processor to monitor a vapor temperature of a cooling solution for preferentially adjust power of a pump or a fan device and an immersion cooling system thereof.

2. Description of the Prior Art

In general, an immersion cooling system usually adopts the cooling design that a heat generating member (e.g. a blade server or a disk array) is immersed in a cooling solution stored in a cooling chamber. In this cooling design, the cooling solution can absorb heat of the heat generating member to generate vapor, and then the vapor can be cooled into liquid by a fan device. Finally, the cooled liquid can be transmitted back to the cooling chamber by a pump, so as to achieve the heat dissipation purpose. However, since power consumption of the immersion cooling system is usually not optimized, meaning that the power of the fan device and the power of the pump are set to a maximum level manually by an operator according to his practical experience, it causes waste of power and a strenuous and time-consuming heat dissipation control process.

SUMMARY OF THE INVENTION

The present invention provides a heat dissipation control method applied to an immersion cooling apparatus for cooling a heat generating member. The immersion cooling apparatus includes a cooling chamber, a pump and a fan device. The heat generating member is immersed in a cooling solution stored in the cooling chamber. The fan device cools vapor generated by the cooling solution into liquid when the cooling solution absorbs heat of the heat generating member. The pump is communicated with the cooling chamber and the fan device for transmitting the vapor to the fan device and transmitting the cooling solution after being cooled to the cooling chamber. The heat dissipation control method includes initializing at least one cooling parameter when the immersion cooling apparatus is turned on, utilizing a sensing processor to detect a vapor temperature in the cooling chamber, the sensing processor preferentially increasing power of the pump when determining the vapor temperature is larger than a maximum of a temperature control range, and the sensing processor preferentially decreasing power of the fan device when determining the vapor temperature is less than a minimum of the temperature control range.

The present invention further provides an immersion cooling system for cooling a heat generating member. The immersion cooling system includes an immersion cooling apparatus and a sensing processor. The immersion cooling apparatus includes a cooling chamber, a fan device, and a pump. The cooling chamber is used for storing a cooling solution and containing the heat generating member to make the heat generating member immersed in the cooling solution. The fan device is used for cooling vapor generated by the cooling solution into liquid when the cooling solution absorbs heat of the heat generating member. The pump is communicated with the cooling chamber and the fan device for transmitting the vapor to the fan device and transmitting the cooling solution after being cooled to the cooling chamber. The sensing processor is electrically connected to the immersion cooling apparatus for detecting a vapor temperature in the cooling chamber, preferentially increasing power of the pump when determining the vapor temperature is larger than a maximum of a temperature control range, and preferentially decreasing power of the fan device when determining the vapor temperature is less than a minimum of the temperature control range.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
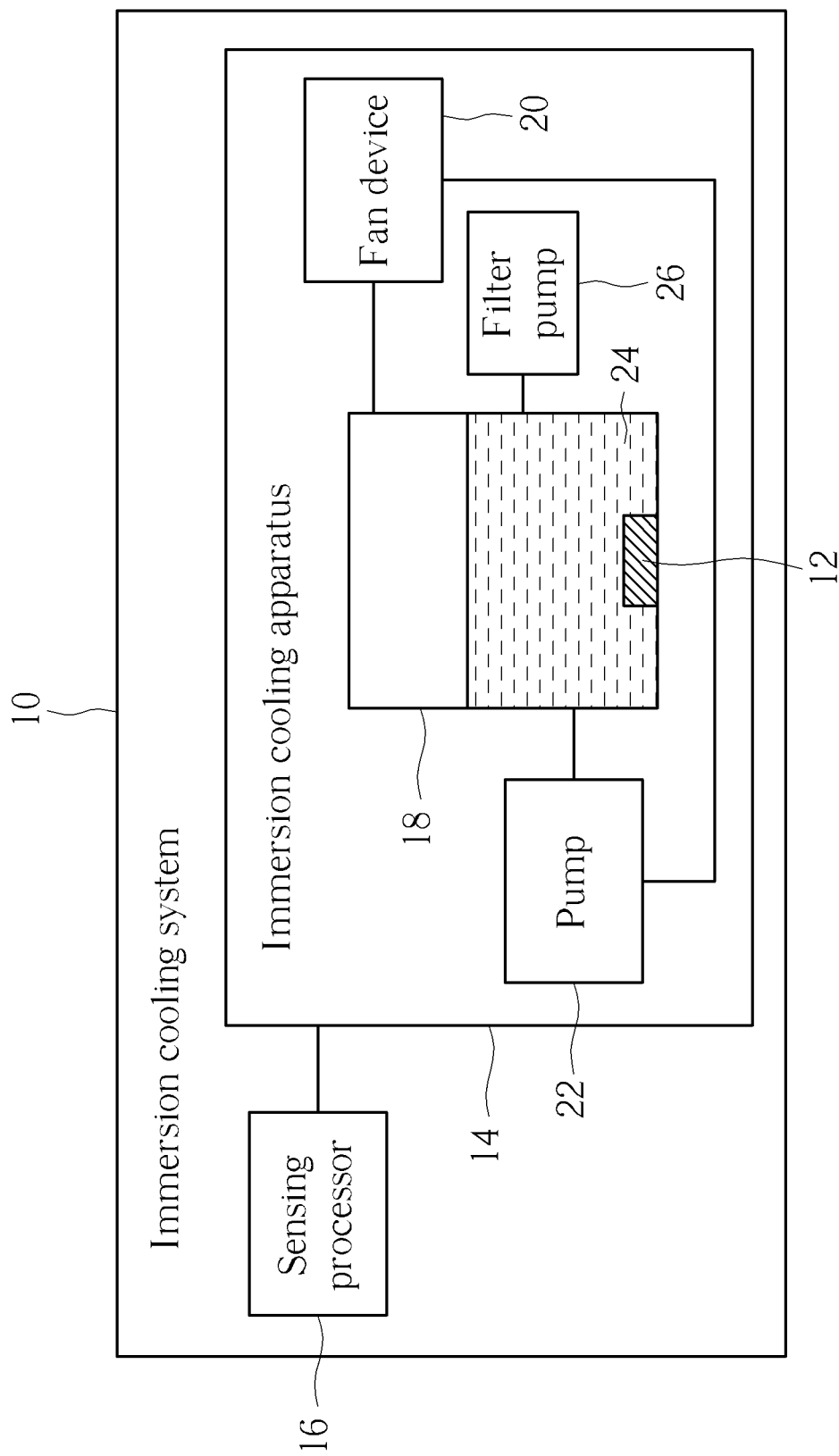
FIG. 1 is a functional block diagram of an immersion cooling system according to an embodiment of the present invention.

Please refer to FIG. 1, which is a functional block diagram of an immersion cooling system 10 according to an embodiment of the present invention. The immersion cooling system 10 is used for cooling a heat generating member 12 (e.g. a blade server or a disk array). As shown in FIG. 1, the immersion cooling system 10 includes an immersion cooling apparatus 14 and a sensing processor 16. The immersion cooling apparatus 14 includes a cooling chamber 18, a fan device 20, and a pump 22. The cooling chamber 18 could be a solution storage chamber commonly applied to an immersion cooling apparatus (the chamber design is commonly seen in the prior art and the related description is omitted herein) for storing a cooling solution 24 and containing the heat generating member 12, so that the heat generating member 12 can be immersed into the cooling solution 24. The cooling solution 24 could be an inert dielectric solution (e.g. mineral oil or silicone oil). The fan device 20 is used for cooling vapor generated by the cooling solution 24 into liquid when the cooling solution 24 absorbs heat of the heat generating member 12. The pump 22 is communicated with the cooling chamber 18 and the fan device 20 for transmitting the vapor to the fan device 20 to cool the vapor and transmitting the cooling solution 24 after being cooled back to the cooling chamber 18. The sensing processor 16 is electrically connected to the immersion cooling apparatus 14 for monitoring a cooling parameter of the immersion cooling apparatus 14 and a vapor temperature of the cooling chamber 18, so as to ensure the immersion cooling apparatus 14 can work properly. As for the related description for the sensing principles (e.g. the related principles for sensing a system temperature, a flow speed of the cooling solution 24, a rotating speed of the pump 22, a rotating speed of the fan device 20, a system pressure, a solution level, and a vapor temperature) of the sensing processor 16, it is commonly seen in the prior art and omitted herein.

Furthermore, in this embodiment, the immersion cooling apparatus 14 could further include a filter pump 26. The filter pump 26 is communicated with the cooling chamber 18 for perform a filtering operation on the cooling solution 24 stored in the cooling chamber 18, so as to prevent poor cooling efficiency caused by particle accumulation (e.g. tiny foreign objects attached to the heat generating member 12) in the cooling solution 24 and short circuit caused by particle conductivity.

Figure 2:
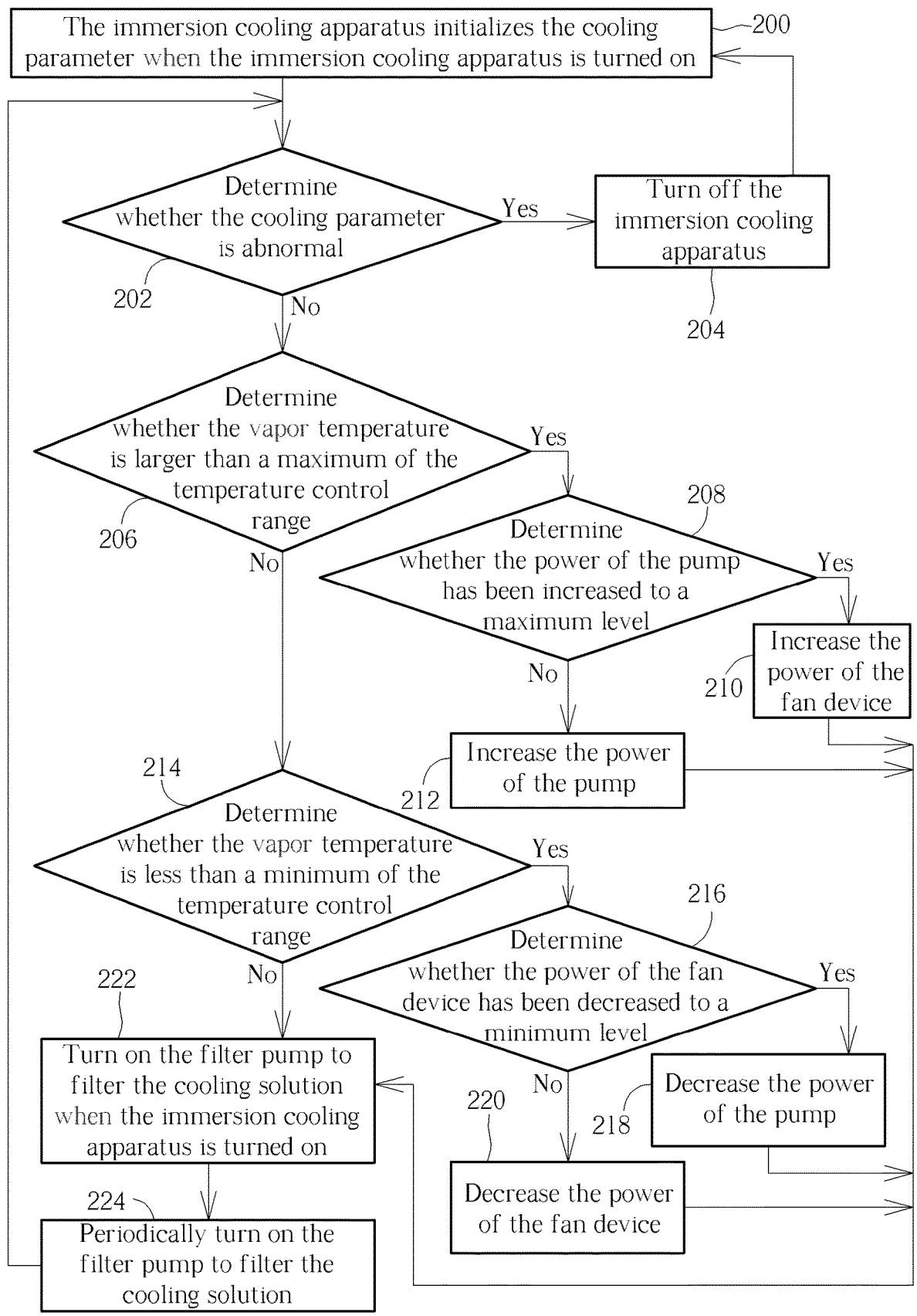
FIG. 2 is a flowchart of a heat dissipation control method according to an embodiment of the present invention.

The heat dissipation control method for the immersion cooling system 10 is described in detail as follows. Please refer to FIG. 1 and FIG. 2. FIG. 2 is a flowchart of the heat dissipation control method according to an embodiment of the present invention. The heat dissipation control method includes the following steps.

Step 200: The immersion cooling apparatus 14 initializes the cooling parameter when the immersion cooling apparatus 14 is turned on.

Step 202: The sensing processor 16 determines whether the cooling parameter is abnormal; if so, go to Step 204; if not, go to Step 206.

Step 204: Turn off the immersion cooling apparatus 14.

Step 206: The sensing processor 16 determines whether the vapor temperature of the cooling chamber 18 is larger than a maximum of the temperature control range; if so, go to Step 208; if not, go to Step 214.

Step 208: The sensing processor 16 determines whether the power of the pump 22 has been increased to a maximum level; if so, go to Step 210; if not, go to Step 212.

Step 210: The sensing processor 16 increases the power of the fan device 20.

Step 212: The sensing processor 16 increases the power of the pump 22.

Step 214: The sensing processor 16 determines whether the vapor temperature of the cooling chamber 18 is less than a minimum of the temperature control range; if so, go to Step 216; if not, go to Step 222.

Step 216: The sensing processor 16 determines whether the power of the fan device 20 has been decreased to a minimum level; if so, go to Step 218; if not, go to Step 220.

Step 218: The sensing processor 16 decreases the power of the pump 22.

Step 220: The sensing processor 16 decreases the power of the fan device 20.

Step 222: The sensing processor 16 turns on the filter pump 26 to filter the cooling solution 24 when the immersion cooling apparatus 14 is turned on.

Step 224: The sensing processor 16 periodically turns on the filter pump 26 to filter the cooling solution 24.

More detailed description for the aforesaid steps is provided as follows. In Step 200, the immersion cooling apparatus 14 can be turned on for performing heat dissipation on the heat generating member 12. During the aforesaid turning-on process, the immersion cooling apparatus 14 can initialize the cooling parameter of the immersion cooling apparatus 14, to ensure that the immersion cooling apparatus 14 can cool the heat generating member 12 in the appropriate cooling parameter. The aforesaid cooling parameter can preferably include a system temperature, a flow speed of the cooling solution 24, a rotating speed of the pump 22, a rotating speed of the fan device 20, a system pressure, and a solution level of the cooling solution 24 (but not limited thereto, meaning that the present invention can adopt other type of cooling parameter according to the practical cooling needs of the immersion cooling apparatus 14). Subsequently, the sensing processor 16 can monitor the aforesaid cooling parameter, and accordingly determines whether the aforesaid cooling parameter is abnormal when the immersion cooling apparatus 14 is turned on (Step 202). If the sensing processor 16 determines that the aforesaid cooling parameter is abnormal (e.g. the system temperature is too high, the flow speed is too slow, the rotating speed of the pump 22 is too slow, the rotating speed of the fan device 20 is too slow, the system pressure is too high, and the solution level is too low), the sensing processor 16 turns off the immersion cooling apparatus 14 for protection until the aforesaid cooling parameter is adjusted back to normal.

After examining the cooling parameter, the sensing processor 16 can monitor the vapor temperature of the cooling solution 24 when the cooling solution 24 absorbs heat of the heat generating member 12, and can accordingly adjust the power of the fan device 20 or the pump 22, so as to optimize the power consumption of the immersion cooling apparatus 14. To be more specific, in Step 206, the sensing processor 16 can determine whether the vapor temperature of the cooling chamber 18 is larger than the maximum of the temperature control range. The temperature control range could preferably be defined by the boiling temperature and the hysteresis temperature of the cooling solution 24 (i.e. the boiling temperature ±the hysteresis temperature), but not limited thereto, meaning that the temperature control range could be adjusted according to the practical experience. When the sensing processor 16 determines the vapor temperature of the cooling chamber 18 is larger than the maximum of the temperature control range, meaning that the immersion cooling system 10 is in an overheated state, the sensing processor 16 can accordingly increase the heat dissipating efficiency of the immersion cooling apparatus 14.

In practical application, since the power consumption of the pump 22 is less than the power consumption of the fan device 20, the sensing processor 16 can preferentially increase the power of the pump 22 for power saving. That is to say, the sensing processor 16 can determine whether the power of the pump 22 has been increased to the maximum level in advance (Step 208). If the sensing processor 16 determines that the power of the pump 22 has not been increased to the maximum level yet, the sensing processor 16 can keep increasing the power of the pump 22 (Step 212), such as increasing the rotating speed of the pump 22 by a PWM (Pulse Width Modulation) method, until the vapor temperature of the cooling chamber 18 falls within the temperature control range. On the contrary, if the sensing processor 16 determines the power of the pump 22 has been increased to the maximum level and the vapor temperature of the cooling chamber 18 is still larger than the maximum of the temperature control range, the sensing processor 16 can increase the power of the fan device 20 (Step 210), such as increasing the rotating speed of the fan device 20 by a PWM method, so that the vapor temperature of the cooling chamber 18 can quickly fall within the temperature control range by simultaneously increasing the power of the pump 22 and the fan device 20 for preventing the immersion cooling system 10 from being overheated.

On the other hand, in Step 214, the sensing processor 16 can determine whether the vapor temperature of the cooling chamber 18 is less than the minimum of the temperature control range. When the sensing processor 16 determines that the vapor temperature of the cooling chamber 18 is less than the minimum of the temperature control range, it means that the heat dissipating efficiency of the immersion cooling system 10 needs to be decreased appropriately. As mentioned above, since the power consumption of the pump 22 is less than the power consumption of the fan device 20, the sensing processor 16 can preferentially decrease the power of the fan device 20 for power saving. That is to say, the sensing processor 16 can determine whether the power of the fan device 20 has been decreased to the minimum level in advance (Step 216). If the sensing processor 16 determines that the power of the fan device 20 has not been increased to the minimum level yet, the sensing processor 16 can keep decreasing the power of the fan device 20 (Step 220), such as decreasing the rotating speed of the fan device 20 by a PWM method until the vapor temperature of the cooling chamber 18 falls within the temperature control range. On the contrary, if the sensing processor 16 determines the power of the fan device 20 has been decreased to the minimum level and the vapor temperature of the cooling chamber 18 is still less than the minimum of the temperature control range, the sensing processor 16 can decrease the power of the pump 22 (Step 218), such as decreasing the rotating speed of the pump 22 by a PWM method, so that the vapor temperature of the cooling chamber 18 can quickly be increased to fall within the temperature control range by simultaneously decreasing the power of the pump 22 and the fan device 20.

In summary, via the design that the power of the pump with a low power consumption is preferentially increased when the vapor temperature is too high and the power of the fan device with a high power consumption is preferentially decreased when the vapor temperature is too low, the present invention not only solves the prior art problem that the heat dissipation control process of the immersion cooling system is strenuous and time-consuming, but also prevents waste of power. In such a manner, the present invention can greatly improve convenience of the immersion cooling system in heat dissipation control and achieve the power saving purpose.

Furthermore, in Step 222, the sensing processor 16 can turn on the filter pump 26 to filter the cooling solution 24 stored in the cooling chamber 18, so as to prevent poor cooling efficiency caused by particle accumulation in the cooling solution 24 and short circuit caused by particle conductivity. Moreover, since the aforesaid problems would still occur after the immersion cooling apparatus 14 is operated over a period of time, the sensing processor 16 can periodically turn on the filter pump 26 to filter the cooling solution 24 according to a specific period (e.g. a week). That is to say, when the sensing processor 16 determines that the operation time of the immersion cooling apparatus 14 is larger than a multiple of the specific period (e.g. one week or two weeks), the sensing processor 16 can turn on the filter pump 26 to filter the cooling solution 24 again, so as to ensure that the cooling operation of the immersion cooling apparatus 14 can be performed properly.

It should be mentioned that the steps of determining whether the cooling parameter is abnormal, turning on the filter pump when the immersion cooling apparatus is turned on, and periodically turning on the filter pump are omissible. For example, in another embodiment, the present invention can only adopt the design for optimizing the power consumption of the immersion cooling apparatus by adjusting the power of the fan device or the pump according to the vapor temperature of the cooling solution, so as to simplify the heat dissipation control design of the present invention. As for the related description for other derived embodiments (e.g. the embodiment in which the present invention only determines whether the cooling parameter is abnormal and monitors the vapor temperature), it could be reasoned by analogy according to the aforesaid embodiment and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipation control method applied to an immersion cooling apparatus for cooling a heat generating member, the immersion cooling apparatus comprising a cooling chamber, a pump and a fan device, the heat generating member being immersed in a cooling solution stored in the cooling chamber, the fan device cooling vapor generated by the cooling solution into liquid when the cooling solution absorbs heat of the heat generating member, the pump being communicated with the cooling chamber and the fan device for transmitting the vapor to the fan device and transmitting the cooling solution after being cooled to the cooling chamber, the heat dissipation control method comprising:

initializing at least one cooling parameter when the immersion cooling apparatus is turned on;

utilizing a sensing processor to detect a vapor temperature in the cooling chamber;

the sensing processor preferentially increasing power of the pump when determining the vapor temperature is larger than a maximum of a temperature control range; and the sensing processor preferentially decreasing power of the fan device when determining the vapor temperature is less than a minimum of the temperature control range.

2. The heat dissipation control method of claim 1, wherein the step of the sensing processor preferentially increasing the power of the pump comprises:

when the power of the pump has been increased to a maximum level and the vapor temperature is larger than the maximum of the temperature control range, the sensing processor increases the power of the fan device.

3. The heat dissipation control method of claim 1, wherein the step of the sensing processor preferentially decreasing the power of the fan device comprises:

when the power of the fan device has been decreased to a minimum level and the vapor temperature is less than the minimum of the temperature control range, the sensing processor decreases the power of the pump.

4. The heat dissipation control method of claim 1 further comprising:

the sensing processor detecting whether the at least one cooling parameter of the immersion cooling apparatus is abnormal when the immersion cooling apparatus is turned on to generate a detection result; and the sensing processor controlling turning on or off of the immersion cooling apparatus according to the detection result;

wherein the at least one cooling parameter comprises at least one of a system temperature, a flow speed of the cooling solution, a rotating speed of the pump, a rotating speed of the fan device, a system pressure, and a solution level.

5. The heat dissipation control method of claim 1, wherein the immersion cooling apparatus further comprises a filter pump, and the heat dissipation control method further comprises:

the sensing processor turning on the filter pump to perform a filtering operation on the cooling solution stored in the cooling chamber when the immersion cooling apparatus is turned on.

6. An immersion cooling system for cooling a heat generating member, the immersion cooling system comprising:

an immersion cooling apparatus comprising:
- a cooling chamber for storing a cooling solution and containing the heat generating member to make the heat generating member immersed in the cooling solution;
- a fan device for cooling vapor generated by the cooling solution into liquid when the cooling solution absorbs heat of the heat generating member; and
- a pump communicated with the cooling chamber and the fan device for transmitting the vapor to the fan device and transmitting the cooling solution after being cooled to the cooling chamber; and a sensing processor electrically connected to the immersion cooling apparatus for detecting a vapor temperature in the cooling chamber, preferentially increasing power of the pump when determining the vapor temperature is larger than a maximum of a temperature control range, and preferentially decreasing power of the fan device when determining the vapor temperature is less than a minimum of the temperature control range.

7. The immersion cooling system of claim 6, wherein when the power of the pump has been increased to a maximum level and the vapor temperature is larger than the maximum of the temperature control range, the sensing processor increases the power of the fan device.

8. The immersion cooling system of claim 6, wherein when the power of the fan device has been decreased to a minimum level and the vapor temperature is less than the minimum of the temperature control range, the sensing processor decreases the power of the pump.

9. The immersion cooling system of claim 6, wherein the sensing processor detects whether the at least one cooling parameter of the immersion cooling apparatus is abnormal when the immersion cooling apparatus is turned on to generate a detection result, the sensing processor controls turning on or off of the immersion cooling apparatus according to the detection result, and the at least one cooling parameter comprises at least one of a system temperature, a flow speed of the cooling solution, a rotating speed of the pump, a rotating speed of the fan device, a system pressure, and a solution level.

10. The immersion cooling system of claim 6 wherein the immersion cooling apparatus further comprises a filter pump, the filter pump is communicated with the cooling chamber, and the sensing processor turns on the filter pump to perform a filtering operation on the cooling solution stored in the cooling chamber when the immersion cooling apparatus is turned on.

\* \* \* \* \*